United States Patent [19]

Engeler et al.

[11] 3,902,186

[45] Aug. 26, 1975

[54] SURFACE CHARGE TRANSISTOR DEVICES

[75] Inventors: William E. Engeler, Scotia; Jerome J. Tiemann, Schenectady, both of N.Y.

[73] Assignee: General Electric Company, Schenectady, N.Y.

[22] Filed: Sept. 9, 1974

[21] Appl. No.: 504,269

Related U.S. Application Data

[63] Continuation of Ser. No. 84,659, Oct. 28, 1970, abandoned.

[52] U.S. Cl................. 357/24; 307/304; 307/221 C

[51] Int. Cl............................................. H01l 13/00

[58] Field of Search............ 357/24; 307/304, 221 C

[56] References Cited

UNITED STATES PATENTS

| | | | |
|---|---|---|---|
| 3,339,128 | 8/1967 | Olmstead | 357/24 |
| 3,387,286 | 6/1968 | Dennard | 357/24 |
| 3,643,106 | 2/1972 | Berwin et al. | 357/24 |
| 3,651,349 | 3/1972 | Kahng et al. | 357/24 |
| 3,654,499 | 4/1972 | Smith | 357/24 |

*Primary Examiner*—Michael J. Lynch
*Assistant Examiner*—E. Wojciechowicz
*Attorney, Agent, or Firm*—Julius J. Zaskalicky; Joseph T. Cohen; Jerome C. Squillaro

[57] ABSTRACT

Surface charge transistor devices including at least two adjacently spaced conductor electrodes insulatingly overlying a semiconductor substrate with a third conductor electrode insulatingly interposed between the adjacently spaced conductor electrodes are disclosed. Electrical charges stored within one storage region underlying one conductor electrode are controllably transferred to another storage region underlying the other conductor electrode with charge and voltage gain by dimensioning the conductor members such that the capacitances of the storage regions are unequal. A plurality of adjacently spaced conductor members with interposed conductor electrodes can be arranged to perform numerous logic and memory functions, both analog and digital. Means for introducing and removing electrical charges are also disclosed.

18 Claims, 10 Drawing Figures

Inventors:
William E. Engeler,
Jerome J. Tiemann,
by [signature]
Their Attorney.

Inventors:
William E. Engeler,
Jerome J. Tiemann,
by Jerome C. Squillaro
Their Attorney.

SURFACE CHARGE TRANSISTOR DEVICES

This is a continuation of application Ser. No. 84,659, filed Oct. 28, 1970, now abandoned.

The present invention relates to semiconductor devices and more particularly to semiconductor surface charge devices. This application is related to our copending applications Ser. No. 56,353 filed July 20, 1970, and Ser. Nos. 69,469, now U.S. Pat. No. 3,770,988 and 69,561 filed Sept. 4, 1970, and concurrently filed applications Ser. Nos. 84,665 and 84,666, all of common assignee to which this invention is assigned and incorporated herein by reference thereto.

Present-day active semiconductor devices which are capable of providing signal gain are basically of at least two types, bipolar transistors and field-effect transistors. The wide acceptance of these devices in such diverse fields as computers, radio receivers, television and numerous other applications is clear evidence of the importance of these devices to technological developments. The complexity and cost of some devices have motivated researchers to develop still further improved semiconductor devices.

It is therefore an object of this invention to provide a new semiconductor device wherein electrical charges are transferred along the surface-adjacent portions of a semiconductor substrate.

It is a further object of this invention to provide a surface charge transistor device which exhibits charge and voltage gain.

It is yet another object of this invention to provide controlled transfer of electrical charge between two surface-adjacent regions of a semiconductor substrate separated by a barrier region.

It is a further object of this invention to provide a plurality of interrelated devices to perform circuit functions.

Briefly, and in accord with one embodiment of our invention, these and other objects are obtained by providing a surface charge transfer device including a pair of spaced conductor members insulatingly disposed over a semiconductor substrate with at least a portion of a third conductor member insulatingly interposed between the adjacently spaced conductor members. Electrical charges in the surface-adjacent portions of the semiconductor substrate underlying one of said conductor members are controllably transferred to another surface-adjacent region underlying the second conductor member by controlling the height of an electrical barrier between the two regions. Direction of charge transfer is dependent upon the relative surface potentials of the charge storage regions underlying the first and second conductor members. Voltage and charge gain are obtained by dimensioning the conductor members such that the capacitances of the conductor members are unequal. For example, if the spacing between the adjacent conductor members is substantially less than the width of the first conductor member, then the capacitance of the overlapping conductor member is less than that of the first adjacent conductor member. The transfer of charge between adjacent storage regions is therefore controlled by a relatively smaller charge on the insulatingly interposed conductor. When the capacitance of the second adjacent member is less than that of the first, the transfer of charge to it produces a larger change in potential than that in either the first or the overlapping conductor members. By arranging a plurality of conductor members in substantially the same manner along the surface of a semiconductor substrate, such that the receiver storage region of one device serves as the source storage region for the next device, numerous memory and logic functions, such as integration, storage, delay and sorting (both digital and analog) can be performed. In addition to storing and transferring information, means for introducing and reading out stored information are also disclosed.

The novel features believed characteristic of the present invention are set forth in the appended claims. The invention itself, together with further objects and advantages thereof, may be best understood with reference to the following detailed description taken in connection with the accompanying drawing in which:

Figures 1, 2, 3:
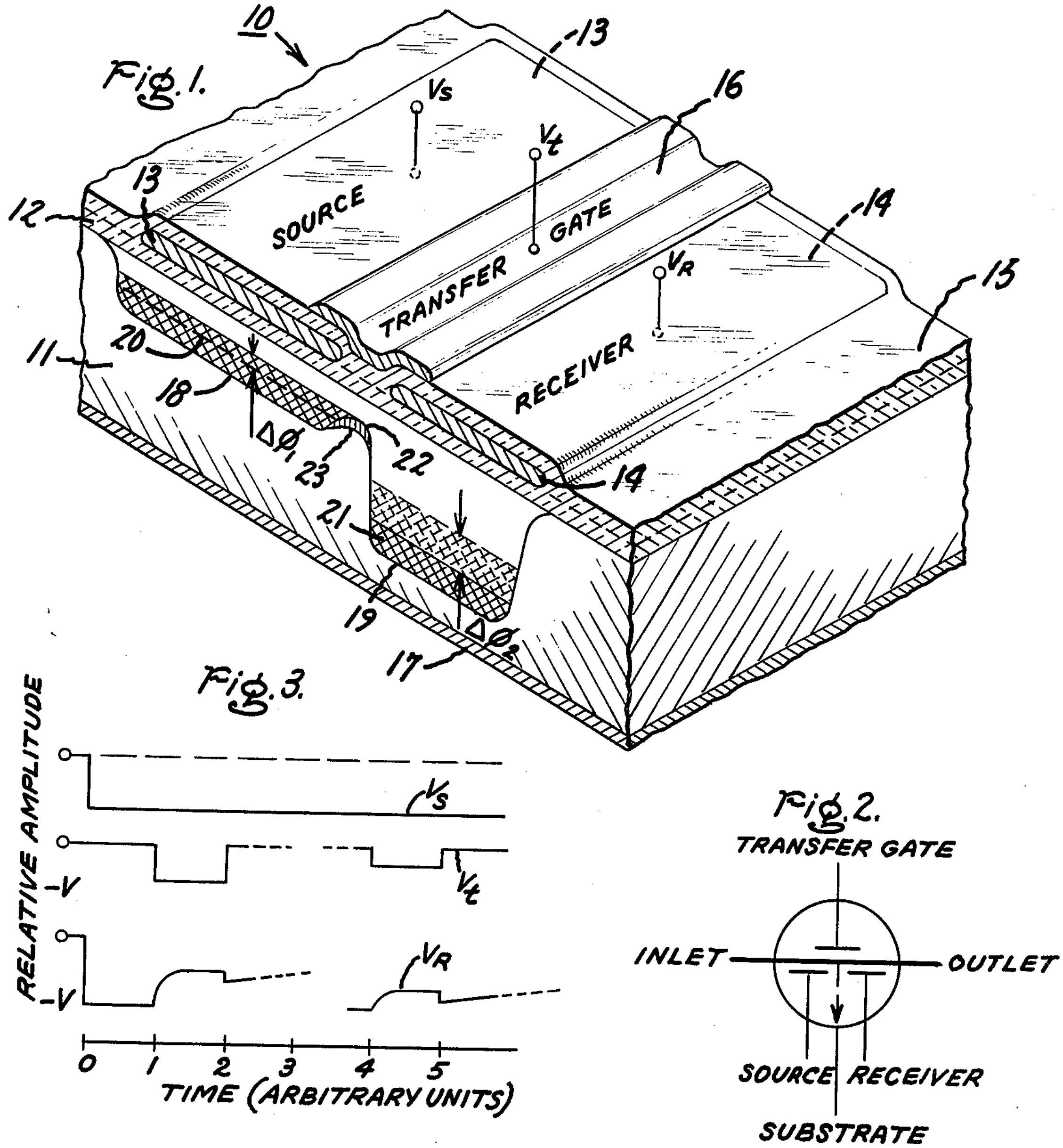
FIG. 1 is a partial perspective view schematically illustrating an embodiment of our invention with typical semiconductor surface potentials resulting from charge transfer.
FIG. 2 is a schematic illustration of a surface charge transistor in accord with one embodiment of our invention.
FIG. 3 illustrates typical voltage waveforms suitable for transferring electrical charges along the surface of the semiconductor substrate.

By way of example, FIG. 1 schematically illustrates a conductor-insulator-semiconductor (CIS) charge storage and transfer device including, in one embodiment of our invention, a surface charge transistor device 10 comprising a semiconductor substrate 11 of one conductivity type, such as N-type silicon, for example. One major surface of the semiconductor substrate 11 is provided with an insulator layer 12 which may, for example, comprise any of the numerous useful semiconductor insulator materials, such as silicon dioxide, silicon nitride, aluminum oxide or silicon oxynitride, for example. The surface charge transistor device further includes first and second conductor members 13 and 14, respectively, disposed over the insulator layer and spaced adjacent to each other along the surface of the insulator material 12. The conductor members 13 and 14 are advantageously formed of materials such as molybdenum, tungsten, doped silicon or germanium or any of the other numerous non-reactive, conducting and semiconducting materials capable of withstanding thermal stresses normally encountered in semiconductor fabrication processes.

The first and second conductor members 13 and 14, respectively, are covered with a thin layer of insulator material 15, which may, for example, include one of the aforementioned insulator materials or any other useful semiconductor insulator material. As illustrated, the thin film of insulator material 15 substantially conforms to the contour of the surface of the insulator layer 12 and the overlying conductor members 13 and 14. A third conductor member 16 is interposed between the adjacently spaced conductor members 13 and 14 and may, for example, include a portion which insulatingly overlies the conductor members 13 and 14, as illustrated in FIG. 1. The conductor member 16 may be formed of any of the aforementioned conductive materials or may additionally include aluminum or gold, for example, where subsequent processing steps do not prove detrimental to their use.

The surface charge transistor structure 10 is completed with a conductive contact 17 applied to the opposite surface of the semiconductor substrate 11 to provide electrical contact to the substrate material. For example, this may be accomplished by alloying the semiconductor substrate material with gold, such as is commonly done in the semiconductor arts. The device may then be packaged and used, for example, as described below or may be used in conjunction with other active and passive semiconductor circuit elements and other surface charge transistors to form integrated circuit elements, some of which are described below.

The surface charge transistor 10 illustrated in this embodiment thereof basically comprises a pair of conductor members insulatingly overlying a semiconductor substrate with a third conductor member interposed therebetween. For purposes of understanding how electrical charges are transferred along the surface-adjacent portion of the semiconductor substrate 11, FIG. 1 illustrates the surface potential underlying the three conductor members. Assume that a charge has been previously introduced into a depletion region under the conductor electrode 13 so that the conductor member 13 may be called a source electrode. Further, let it be assumed that the electrical charge under the source electrode is to be transferred to and collected or received by a deeper depletion region under the second conductor member 14 which is hereinafter referred to as the receiver electrode. The transfer of electrical charges from a semiconductor surface-adjacent region underlying the source electrode to a semiconductor surface-adjacent region underlying the receiver electrode is controlled by the magnitude of a voltage applied to the interposed conductor member 16. The conductor member 16 is therefore referred to as a transfer gate electrode. In one of its simplest forms, therefore, the surface charge transistor 10 comprises a source electrode, a transfer gate electrode and a receiver electrode. Since bias voltages are applied with reference to the semiconductor substrate, the contact made thereto is called the substrate electrode.

FIG. 2 is a schematic representation of a surface charge transistor including source and receiver electrodes with a transfer gate electrode for controlling the transfer of charge therebetween. FIG. 2 also illustrates the substrate electrode and further illustrates that yet other electrodes may be adjacently spaced along the left and right surfaces of the substrate which function as the inlet and outlet for surface charge so that the surface charge transistor is not limited to a three-electrode device, but rather may include any number of electrodes and still function as a surface charge transistor. This latter feature of our invention is discussed more fully below in accord with another embodiment of our invention.

The operation of the surface charge transistor 10 is now described with reference to the timing waveforms of FIG. 3 wherein the various voltages appearing on the source electrode, transfer gate and receiver electrode are illustrated. Only relative voltage amplitudes are illustrated since the actual amplitudes of the various voltage signals may vary depending upon the thickness of the insulator material and the amount of charge to be stored and transferred. For example, if the insulator layer 12 has a thickness of 1,000 Angstroms, voltage magnitudes may vary between 5 and 20 volts, for example. The application of a voltage $V_S$ to the source electrode 13, as illustrated in FIG. 3, produces a depletion region 18 in the surface-adjacent portion of the substrate 11 substantially underlying the source electrode 13. The depth of the depletion region and hence the charge storage capacity varies proportionately with the magnitude of the applied voltage. The maximum electrical charge which may be stored is also a function of the magnitude of the depletion region-forming voltage and the magnitude of the area underlying the source electrode. The depletion region 18 underlying the source electrode provides storage of electrical charge and hence is hereinafter referred to as a source storage region.

In operation then, the application of a voltage $V_S$ to the source electrode 13 causes an electric field to exist at the surface-adjacent portion of the semiconductor substrate. Minority carriers, either introduced by electromagnetic radiation, a P-N junction or a point contact, for example, are stored within the storage region 18. By whatever means employed, the electrical charges may be considered to be introduced through the inlet. The application of a voltage $V_R$ to the receiver electrode 14 during at least a portion of the same time interval will also cause minority carriers to be stored within a storage region 19 underlying the receiver electrode 14. As illustrated, the magnitude of the voltage $V_R$ is greater than that of $V_S$ and hence the electrical charges are stored at a lower surface potential within the surface-adjacent portion of the semiconductor substrate in region 19 as opposed to region 18. Let it be assumed that the charges within source storage region 18 produce the changes in surface potential illustrated by the shaded region 20 and that the electrical charges stored within the receiver storage region 19 produce the changes in surface potential illustrated by the shaded region 21. The electrical charges which are stored at the semiconductor surface underlying conductors 13 and 14, then reside at potentials represented by the upper boundaries of cross-hatched regions 20 and 21, respectively.

FIG. 1 illustrates the existence of an electrical barrier region 22 underlying the transfer gate electrode 16. This barrier region exists since the semiconductor substrate material 11 in the region underlying the gate electrode 16 is not primarily under the influence of the electric fields of either the source or receiver electrodes, but rather is under the influence of a field from the transfer gate electrode. The voltage applied to the transfer electrode is controlled so that this region is under the influence of a lesser field and therefore the surface potential in this region is more positive than that in the surrounding regions. The barrier region 22 performs a very significant function in the operation of our invention. In particular, the maintenance of the barrier level above the charge level in the source storage region 18 insures electrical isolation between electrical charges 20 and electrical charges 21. The electrical barrier 22 therefore provides electrical isolation between the two adjacent storage regions.

The application of a voltage $V_T$ to the transfer gate electrode 16, however, lowers the electrical barrier level 22 in proportion to the magnitude of the applied voltage. When the barrier level is lowered below the charge level in the storage region 18, as shown by potential 23, electrical charges from this storage region are permitted to flow to the next adjacent storage region 19. The amount of charge permitted to flow between the storage region 18 and the storage region 19 is dependent in part upon the barrier level 23 remaining between the adjacent storage regions and the area of the storage region 18 underlying the source electrode 13. More specifically, if the potential of the barrier is lowered by an amount $\Delta\phi$, the amount of additional charge transferred will be given by $C_s\Delta\phi$ where $C_s$ is the capacitance of the source storage region.

If the area of the receiver storage region 19 is less than that of source storage region 18, the receiver capacitance $C_r$, is correspondingly less than the source capacitance $C_s$. Therefore, upon lowering the barrier level between these regions, the transfer of charge causes a change in surface potential $\Delta\phi_1$ within the source storage region 18 and a greater change in surface potential $\Delta\phi_2$ in the receiver storage region 19. Since the charge transferred is given both by $C_s\Delta\phi_1$ and $C_r\Delta\phi_2$, the change in surface potential $\Delta\phi_2$ divided by the change in surface potential $\Delta\phi_1$ is therefore the voltage gain of the charge transfer device. The voltage gain is thus also equal to the ratio of $C_s$ to $C_r$.

In addition to obtaining voltage gain, charge gain is also obtained. The charge gain is equal to the charge transferred $Q_t$ divided by the change in charge $\Delta Q_g$ necessary to effect the transfer. Stated differently, the charge gain is approximately equal to the ratio of the capacitance of the source storage region to that of the transfer gate electrode.

FIG. 3 illustrates the effect on the receiver electrode 14 of lowering the barrier level 22 by applying different voltage level signals to the transfer gate electrode 16. In particular, at time $t_1$ the voltage $V_R$ on the receiver electrode 14 begins to increase in a positive direction in proportion to the magnitude of the transferred charge which, in turn, is controlled by the extent of lowering of the barrier level 22. As illustrated, the transfer gate voltage $V_T$ during the time interval $t_1$ to $t_2$ is substantially more negative than the transfer gate voltage applied during the time period $t_4$ to $t_5$ with proportionately larger charge transfers occurring. The small negative excursions in voltage at the times $t_2$ and $t_5$ are a result of the capacitive interaction of the gate electrode with the receiver electrode. The steady decay of voltage on the receiver electrode 14 as illustrated in FIG. 3 by the slotted portion of voltage $V_R$ is due primarily to the discharge of the receiver capacitance through a receiver load resistor in the output circuit. The output circuit may also advantageously include a field-effect transistor in parallel with the load resistor and have its gate electrode controlled in accord with a desired circuit function, if desired.

The above discussion has been directed primarily to the transfer of charge from the source storage region 18 to the receiver storage region 19 by controlling the height of the barrier region 22. In addition to this advantageous mode of operation, the surface charge transistor device 10 can also be used with a fixed barrier height. In this case, charge is introduced into the source storage region 18 until it exceeds the barrier level and flows into the receiver storage region 19. By monitoring the voltage on the receiver electrode, it is therefore possible to detect this overflow of charge. Accordingly, the surface charge transistor device 10 may be utilized as a sensing or detecting element which provides a changed output signal only when the charge level in the source storage region exceeds the selectively variable barrier level.

Figures 5, 6, 7, 8, 9A, 9B:
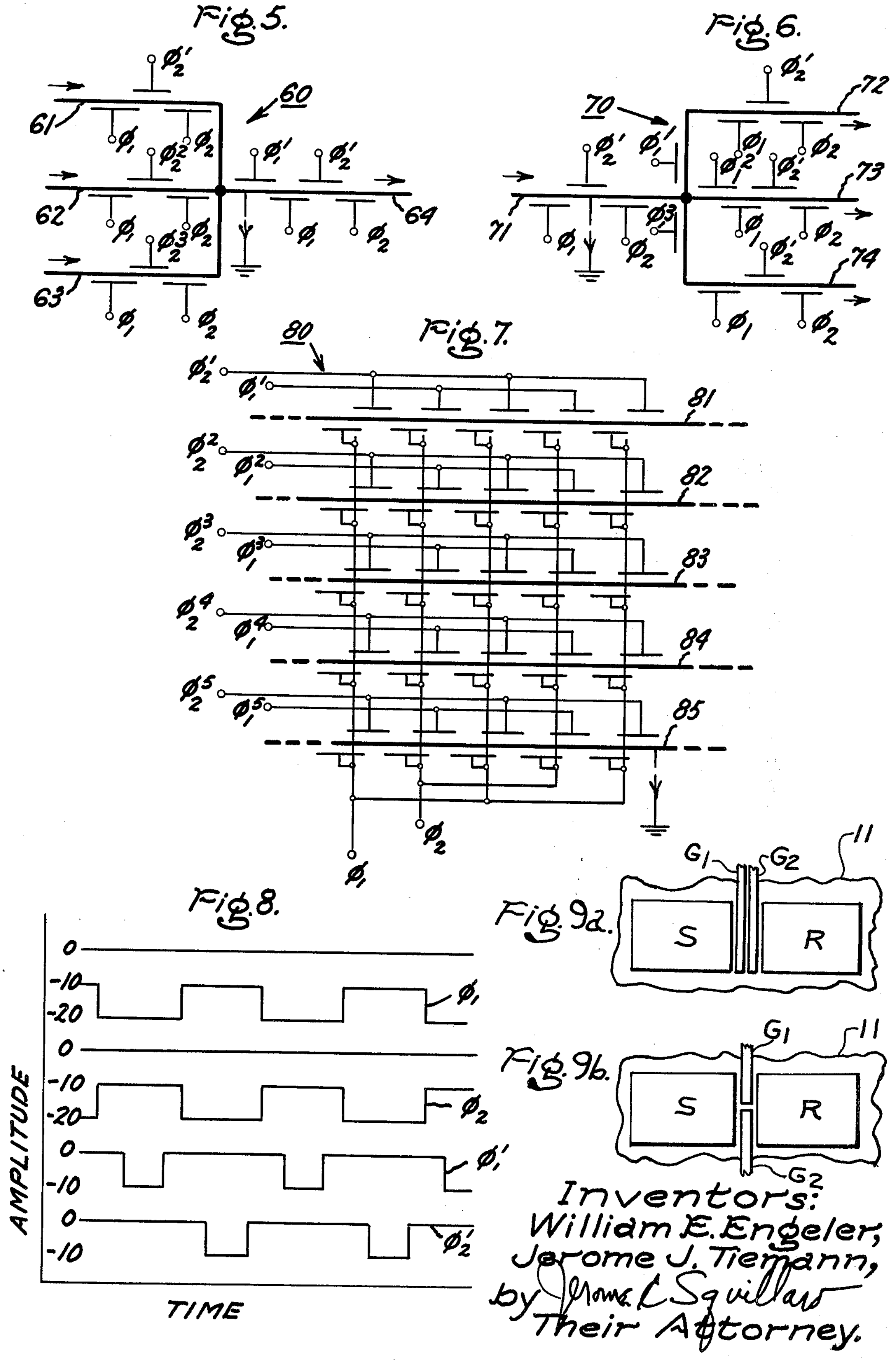
FIG. 5 is a schematic illustration of an interconnection of surface-charge devices to perform a summation function in accord with an embodiment of our invention.
FIG. 6 is a schematic illustration of an interconnection of surface-charge devices to perform a sorting function in accord with another embodiment of our invention.
FIG. 7 is a schematic illustration of an array of memory elements arranged in rows and columns to provide charge storage and readout.
FIG. 8 illustrates a group of two phase clocking signals suitable for use in the operation of the devices of FIGS. 4, 5, 6 and 7.
FIG. 9A and FIG. 9B show other embodiments of our invention.

Further, our invention can be practised by using multiple transfer gates interposed between the source and receiver electrodes. For example, two or more transfer gates can be adjacently spaced so that the underlying barrier region is controlled by a combination of voltage signals applied to the transfer gate electrodes as shown in FIG. 9A. In this figure transfer gate electrodes $G_1$ and $G_2$ are adjacently spaced or in tandem between source electrode S and receiver electrode R in insulating relationship thereto and to the substrate 11. Alternately, two or more transfer gate electrodes may be positioned end-to-end between the source and receiver electrodes so that an electrical charge can be transferred between the underlying source and receiver storage regions by lowering the barrier region under any or all of the transfer gate electrodes as shown in FIG. 9B. In this figure transfer gate electrodes $G_1$ and $G_2$ are positioned end-to-end between source electrode S and receiver electrode R in insulating relationship thereto and to the substrate 11. These multiple gate devices are particularly useful, for example, for performing "AND" and "OR" logic functions.

In addition to multiple gate devices, multiple source and multiple receiver devices are also useful. For example, multiple source devices can be used for charge summation purposes. Multiple receiver devices can be used for charge division, for example. Combinations of multiple sources and multiple receivers with a common transfer gate electrode can be used to transfer large numbers of electrical charges simultaneously. These latter devices may be fabricated, for example, in the manner described in the above-identified copending applications.

Still other modifications of our invention are contemplated. For example, the insulator layer thickness underlying the electrodes may differ from one electrode to the next and, in fact, the transfer gate electrode may be positioned closer to the substrate than the source and receiver electrodes, if desired. Also, the source storage region need not be an equipotential region, but may vary with the insulator layer thickness, for example. Our invention, therefore, may be practised with various modifications and changes of the disclosed embodiments. Accordingly, our claims are intended to cover all such modifications and changes as fall within the true spirit and scope of our invention.

Whereas the foregoing embodiments of our invention have wide utility in and of themselves, certain characteristic features of our invention make it particularly attractive for the storage and transfer of electrical charges representative of either digital or analog information. For example, where different charge levels are representative of different binary states, a long train of storage regions separated by barrier regions with overlying conductor members controlling the storage and transfer of electrical charges may be advantageously employed as a shift register, for example. Alternately, such an arrangement of storage regions may be utilized to provide a circulating memory or a delay line. Accordingly, while FIG. 1 is illustrative of only one embodiment of our invention, the basic principles of storage and transfer of electrical charges are applicable to each of the other aforementioned devices. Those skilled in the art can readily appreciate that various physical embodiments may be devised to perform specific functions; however, the basic storage and controlled transfer of electrical charge as disclosed with reference to FIG. 1 above is a common characteristic feature of each of these physical embodiments.

Figure 4:
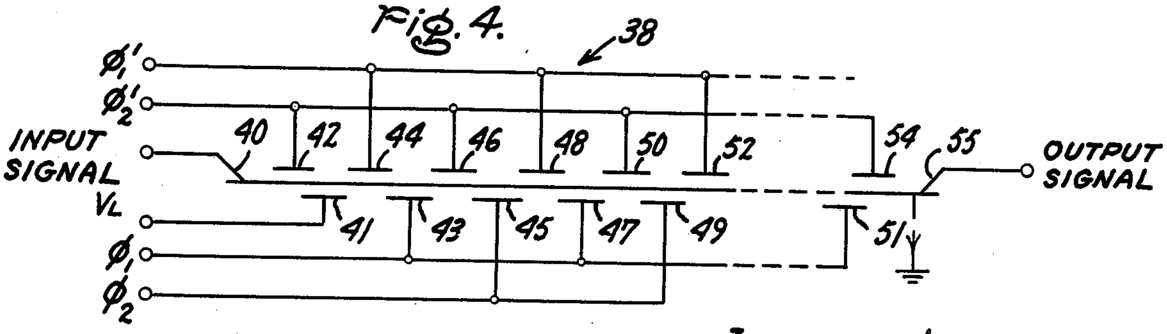
FIG. 4 is a schematic illustration of a plurality of surface charge transistors arranged with input and output devices for providing a shift register function.

FIG. 4, for example, schematically illustrates an advantageous arrangement of CIS charge storage and transfer devices 38 which perform the function of shifting electrical charges in accord with a clocking system. This function is primarily characteristic of a shift register, but as is apparent to those skilled in the art, may be employed for various other purposes. In this embodiment, an input signal representative of digital information in the form of a binary code, for example, is introduced into the surface-adjacent regions of a semiconductor substrate by a launch device 40, which may, for example, include a P-N junction, such as is more fully disclosed in our copending application Ser. No. 69,649, now U.S. Pat. No. 3,770,988. An electrical charge introduced into the substrate in this manner is transferred to a first source storage location underlying electrode 41 via the launch gate 42. The source electrode 41 is connected to a D.C. voltage $V_L$, for example, to establish the desired charge level. Two-phase clocking signals $\phi_1$ and $\phi_2$, such as those illustrated in FIG. 8, are connected to storage elements 43, 45, 47, 49 and 51 while control electrodes 42, 44, 46, 48, 50, 52, and 54 are connected to clocking signals $\phi$ 1′ and $\phi_2'$. By appropriately selecting the clocking pulses to store and transfer electrical charges along the surface-adjacent portion of the semiconductor substrate such that charges are controllably transferred from one storage region to another, a train of input charges may be transferred along the surface of the substrate at a rate determined by the frequency of the clocking signals. Eventually, the train of signals applied at the input will arrive at the last storage location, which is illustrated by the numeral 51. The charge may be removed from the substrate by a charge receive device 55, such as a P-N junction, formed in the surface-adjacent region of the semiconductor substrate and having a portion thereof underlying the transfer electrode 54. In this way, the charge within the storage region underlying electrode 51 is transferred to the P-N junction and provides an output signal for external circuitry. A charge receive device suitable for performing this function is more fully described in our aforementioned U.S. Pat. No. 3,770,988. Those skilled in the art can readily appreciate that various combinations of clocking signals may be employed for transferring charges along the surface-adjacent portions of a semiconductor substrate and that those illustrated in FIG. 8 are merely illustrative of one group of clocking signals suitable for operation of the embodiment of our invention illustrated in FIG. 4.

FIG. 5 schematically illustrates another embodiment of our invention wherein the interconnection of surface charge devices performs a specific logic function, such as addition, for example. This logic function is performed by an adder 60 comprising three surface-adjacent storage and transfer channels 61, 62 and 63 wherein surface charges are transferred from left to right, for example, and combined or added in a single channel 64. The transfer of surface charges along the channels 61, 62 and 63 are performed in substantially the same manner described above with reference to FIGS. 1 and 4 and as further described in greater detail in our copending application Ser. No. 84,666. As illustrated, electrical charges are transferred from one storage region to another by the application of voltage signals $\phi_1$ and $\phi_2$ to the storage electrodes and voltage signals $\phi_1'$ and $\phi_2'$ to the transfer gate electrodes. FIG. 8 illustrates typical voltage signals suitable for practising this embodiment of our invention. The storage electrodes may be connected to the same voltage signals and clocked at the same time, however, the transfer of charge between adjacent storage elements may be selectively controlled by applying different transfer voltage signals $\phi_2^1$, $\phi_2^2$ and $\phi_2^3$ to the transfer gates. In this way, surface-adjacent charges transferred along the storage channel 61 may be first directed into the channel 64 while the charges in storage channel 62 and 63 are held within their respective storage regions without being transferred. At some later point in time, the information in either or both of the other channels 62 and 63 may then be sequentially transferred into the storage channel 64. Those skilled in the art can readily appreciate that various other modes of operation are possible once the basic structure is disclosed. For example, where analog signals are stored in the channels 61, 62 and 63, the signals may be combined or summed simultaneously if desired.

By way of further example, FIG. 6 illustrates a device substantially similar to that illustrated in FIG. 5, however, in this instance, the electrical charges are being sorted, i.e., some electrical charges are directed along a specific transfer channel for whatever purpose intended. This device is particularly useful in sorting data in accord with specified criteria. For example, referring to FIG. 6, a sorting device 70 is illustrated as comprising an input channel 71 connected to three output channels 72, 73 and 74, respectively. By connecting the storage control elements in the manner illustrated, and by applying transfer signals $\phi_1^1$, $\phi_1^2$ and $\phi_1^3$ to the transfer gate electrodes in accord with the desired sorting, electrical charges transferred along the channel 71 may be directed into any of the three output channels. This embodiment of our invention is particularly useful in data analysis.

Another embodiment of our invention which is particularly useful in providing memory arrays is illustrated in FIG. 7. This embodiment of our invention includes a CIS charge storage and transfer memory 80 including an array of storage channels 81 through 85 arranged in rows with the storage regions of each channel interconnected in such a manner as to transfer charge from one storage region to the next adjacent storage region by appropriately providing control signals to the transfer gates between the adjacent storage regions. As illustrated in FIG. 7, the storage of electrical charges is provided by a two-phase voltage system comprising voltage signals $\phi_1$ and $\phi_2$ and a plurality of transfer control signals with $\phi_1'$ and $\phi_2'$ through $\phi_1^5$ and $\phi_2^5$ connected to alternate transfer gate electrodes in the manner illustrated in the drawing. Each row of transfer electrodes is connected in a similar manner to a different set of transfer control signals so that the transfer of charge along any particular row can be provided independently of any other row in the array. Means for providing transfer signals to a selected row are well known in the art and form no part of the present invention. FIG. 8, however, illustrates typical voltage waveforms suitable for practising this embodiment of our invention.

The embodiment of our invention illustrated in FIG. 7 is particularly useful for storing minority carriers generated by electromagnetic radiation, for example, such as might be obtained by subjecting the memory array to a light image. In this situation, the storage regions would be activated by the voltage signals applied to the storage regions and would integrate the optical image incident thereon. On a time sequential basis, this information can be read out of the array on a row-by-row basis to a suitable output device, such as is described in our aforementioned U.S. Pat. No. 3,770,988, for use as a video signal, for example, representative of the information stored in the array. Those skilled in the art can readily appreciate the significance of this embodiment of our invention where a high resolution optical-electrical converter is required. Further, this embodiment of our invention is not limited to analog signal information, but also includes the use of digital information which is read into the array by a coded electromagnetic radiation signal. Accordingly, this embodiment illustrates, by way of example, yet another application of our invention.

Those skilled in the art can appreciate that numerous other attendant advantages flow from our invention. For example, in the storage and transfer of electrical charges representative of information, only two storagee regions are required per "bit" of information, thereby increasing both density and speed of storage arrays. Further, by leaving a residual charge in each storage region, an increased rate of charge transfer is achieved. Still further, since the storage regions are never "turned off" during operation, no undesirable charge injection into the semiconductor bulk occurs. By proportioning the barrier regions to be substantially narrower than the storage regions, the amount of charge lost per transfer by turning off the barrier region is significantly reduced.

Those skilled in the art can readily appreciate that although our invention is described with reference to certain specific embodiments, various changes and modifications may be made thereto without departing from the spirit and scope of our invention. For example, whereas our invention has been described with reference to a semiconductor substrate of silicon material, other semiconductor materials, such as germanium, Group III-V and II-VI semiconductor compounds, such as cadmium sulfide, gallium arsenide and indium antimonide may be employed and other useful insulator materials different from those described above, may also be employed if desired. Additionally, various methods for making semiconductor devices in accord with our invention are contemplated. For example, the semiconductor technology employed in the fabrication of field-effect transistors, may advantageously be employed. Of particular value is the method for making self-registered field-effect transistors more fully described in our copending patent applications Ser. Nos. 675,227, now U.S. Pat. No. 3,640,782 and 675,228, now U.S. Pat. No. 3,566,517 filed Oct. 13, 1967, and incorporated herein by reference thereto. These applications disclose process technology compatible with the surface charge transfer devices described herein.

The foregoing description of various embodiments of our invention refers occasionally to the transfer gate or transfer electrode as overlapping adjacently spaced storage electrodes, such as the source and receiver electrodes. It is to be understood, however, that the desirability of providing an overlapping electrode is primarily for the purposes of ease of fabrication since it reduces the tolerances for mask registration in the formation of the overlying electrodes. From a strictly functional standpoint, therefore, the transfer gate electrode need not physically overlap the underlying storage electrodes. In fact, any configuration of the transfer gate electrode which effectively provides a means for controlling the barrier region between adjacent storage regions is all that is required.

In summary, we have disclosed a new and novel surface charge transistor and devices employing such transistors wherein charge storage and transfer are provided. Voltage and charge gain are achieved by proportioning the areas of the storage electrodes so that transferred charge provides a larger increase in surface potential in the received storage region than in the source storage region. Means are also disclosed for introducing charge into a plurality of charge transfer devices and for extracting such charges along the surface-adjacent portions of a semiconductor substrate. In addition, various novel arrangements of surface-charge devices to perform numerous logic functions are also disclosed.

In view of the foregoing, it is apparent that many modifications and changes may be made to our invention without departing from the spirit and scope thereof. Accordingly, we intend, by the appended claims, to cover all such modifications and changes as fall within the true spirit and scope of our present invention.

What we claim as new and desire to secure by Letters Patent of the United States is:

1. A semiconductor device comprising a substrate of semiconductor material of one conductivity type, a first source conductor member insulatingly overlying said substrate, a first receiver conductor member insulatingly overlying said substrate, a first transfer gate conductor member insulatingly overlying said substrate and having at least a portion thereof spaced between said first source conductor member and said first receiver conductor member and insulated from said first source conductor member and said first receiver conductor member, means applying a first voltage between said first source conductor member and said substrate to form a first charge storage region in said substrate, means applying a second voltage between said first receiver conductor member and said substrate to form a second charge storage region in said substrate, said second charge storage region being spaced from said first charge storage region to form a barrier region between said storage regions and underlying said first transfer gate conductor member, means applying a third voltage different from said first and second voltages between said first transfer gate conductor member and said substrate for controllably varying the surface potential of said barrier region for controlling the transfer of charge from either one of said first storage region and said second storage region to the other one thereof.

2. The semiconductor device of claim 1 in which said first transfer gate conductor member insulatingly overlies and at least partially overlaps portions of said first source conductor member and said first receiver conductor member.

3. The combination of claim 1 including means for introducing charge into said first storage region and means for removing charge from said second storage region.

4. The device of claim 1 in which is included a second receiver conductor member insulatingly overlying said substrate, a second transfer gate conductor member insulatingly overlying said substrate and having at least a portion thereof spaced between said first source conductor member and said second receiver conductor member, means applying said second voltage between said second receiver conductor member and said substrate to form a third charge storage region in said substrate, said third charge storage region being spaced from said first charge storage region to form a second barrier region therebetween and underlying said second transfer gate conductor member, means applying a fourth voltage between said second transfer gate conductor member and said substrate for controllably varying the surface potential of said second barrier region for controlling the transfer of charge from said first storage region to said third storage region.

5. A semiconductor device comprising a substrate of semiconductor material of one conductivity type, a first source conductor member insulatingly overlying said substrate, a first receiver conductor member insulatingly overlying said substrate, a first transfer gate conductor member insulatingly overlying said substrate and having at least a portion thereof spaced between said first source conductor member and said first receiver conductor member and insulated from said first source conductor member and said first receiver conductor member, means applying a first voltage between said first source conductor member and said substrate to form a first charge storage region in said substrate, means applying a second voltage between said first receiver conductor member and said substrate to form a second charge storage region in said substrate, said second charge storage region being spaced from said first charge storage region to form a barrier region between said storage regions and underlying said first transfer gate conductor member, means applying a third voltage between said first transfer gate conductor member and said substrate for controllably varying the surface potential of said barrier region for controlling the transfer of charge from said first storage region to said second storage region, the charge storage capacity of said first storage region being greater than the charge storage capacity of said second storage region.

6. The device of claim 5 in which the area of said first receiver conductor member is less than the area of said first source conductor member.

7. A semiconductor device comprising a substrate of semiconductor material of one conductivity type, a first source conductor member insulatingly overlying said substrate, a first receiver conductor member insulatingly overlying said substrate, a first transfer gate conductor member insulatingly overlying said substrate and having at least a portion thereof spaced between said first source conductor member and said first receiver conductor member and insulated from said first source conductor member and said first receiver conductor member, means applying a first voltage between said first source conductor member and said substrate to form a first charge storage region in said substrate, means applying a second voltage between said first receiver conductor member and said substrate to form a second charge storage region in said substrate, said second charge storage region being spaced from said first charge storage region to form a barrier region between said storage regions and underlying said first transfer gate conductor member, means applying a third voltage between said first transfer gate conductor member and said substrate for controllably varying the surface potential of said barrier region for controlling the transfer of charge from said first storage region to said second storage region, a second source conductor member insulatingly overlying said substrate, said first transfer gate conductor member insulatingly overlying said substrate having at least a portion thereof spaced between said second source conductor member and said first receiver conductor member, means applying said first voltage between said second source conductor member and said substrate to form a third charge storage region in said substrate, said third charge storage region being spaced from said second charge storage region to form a second barrier region underlying said first transfer gate conductor member, said third voltage controllably varying the surface potential of said second barrier region for controlling the transfer of charge from said third charge storage region to said second charge storage region.

8. A semiconductor device comprising a substrate of semiconductor material of one conductivity type, a plurality of source and receiver conductor members insulatingly overlying said substrate, a plurality of transfer gate conductor members insulatingly overlying said substrate, each spaced between adjacent source and receiver conductor members, means applying a first pulsating voltage to alternate ones of said source and receiver conductor members to form first charge storage regions in said one conductivity substrate, means applying a second pulsating voltage oppositely phased with respect to said first pulsating voltage between the other of said source and receiver conductor members to form second charge storage regions in said one conductivity substrate, said second charge storage regions being spaced from said first charge storage regions to form a plurality of barrier regions within said one conductivity substrate each underlying a respective one of said transfer gate conductor members, means applying a third pulsating voltage different from said first and second pulsating voltages to one set of alternate transfer gate conductor members for alternately lowering the potentials of a corresponding set of barrier regions to permit charge transfer thereacross, means applying a fourth pulsating voltage different from said first and second pulsating voltages to the other set of alternate transfer gate conductor members for alternately lowering the potentials of a corresponding set of barrier regions to permit charge transfer thereacross, said third and fourth voltages being oppositely phased with respect to one another and being synchronized with said first and second voltages.

9. The semiconductor device of claim 8 including means for introducing electrical charge into one of said first storage regions, and means for removing electrical charge from one of said second storage regions.

10. The device of claim 8 in which the capacitance of each of said first transfer gate conductor members in relation to said substrate and in relation to a respective adjacent one of said first source conductor members and a respective adjacent one of said first receiver conductor members is less than the capacitance of said adjacent one of said first source conductor members.

11. The device of claim 8 in which the leading and lagging edges of each pulse of said third pulsating voltage lies between the leading and lagging edges of a respective pulse of said first pulsating voltage, and in which the leading and lagging edges of each pulse of said fourth pulsating voltage lying between the lagging edge of a respective pulse of said first pulsating voltage and the leading edge of a succeeding pulse of said first pulsating voltage.

12. A semiconductor device comprising a substrate of semiconductor material of one conductivity type, a first source conductor member insulatingly overlying said substrate, a first receiver conductor member insulatingly overlying said substrate, a first transfer gate conductor member insulatingly overlying said substrate and having at least a portion thereof spaced between said first source conductor member and said first receiver conductor member and insulated from said first source conductor member and said first receiver conductor member, means applying a first voltage between said first source conductor member and said substrate to form a first charge storage region in said substrate, means applying a second voltage between said first receiver conductor member and said substrate to form a second charge storage region in said substrate, said second charge storage region being spaced from said first charge storage region to form a barrier region between said storage regions and underlying said first transfer gate conductor member, means applying a third voltage between said first transfer gate conductor member and said substrate for controllably varying the surface potential of said barrier region for controlling the transfer of charge from said first storage region to said second storage region, the capacitance of said first storage region being greater than the capacitance of said first transfer gate conductor member in relation to said substrate and in relation to said first source conductor member and said first receiver conductor member whereby the charge required to be supplied to said first transfer gate conductor member to effect transfer of a given quantity of charge from said first storage region to said second storage region is less than said given quantity of charge.

13. A semiconductor device comprising a substrate of semiconductor material of one conductivity type, a first source conductor member insulatingly overlying said substrate, a first receiver conductor member insulatingly overlying said substrate, a first transfer gate conductor member insulatingly overlying said substrate and having at least a portion thereof spaced between said first source conductor member and said first receiver conductor member and insulated from said first source conductor member and said first receiver conductor member, means applying a first voltage between said first source conductor member and said substrate to form a first charge storage region in said substrate, means applying a second voltage between said first receiver conductor member and said substrate to form a second charge storage region in said substrate, said second charge storage region being spaced from said first charge storage region to form a barrier region between said storage regions and underlying said first transfer gate conductor member, means applying a third voltage between said first transfer gate conductor member and said substrate for controllably varying the surface potential of said barrier region for controlling the transfer of charge from said first storage region to said second storage region, a second transfer gate conductor member insulatingly overlying said substrate and having at least a portion thereof spaced between said first transfer gate conductor member and one of said source and receiver conductor members, said first transfer gate conductor member overlying one portion of said barrier region and said second transfer gate conductor member overlying another portion of said barrier region, said portions of said barrier region arranged in side by side relationship between said first storage region and said second storage region, means applying a fourth voltage between said second transfer gate conductor member and said substrate for controllably varying the surface potential of said other portion of said barrier region for controlling the transfer of charge from said first storage region to said second storage region.

14. A semiconductor device comprising a substrate of semiconductor material of one conductivity type, a first source conductor member insulatingly overlying said substrate, a first receiver conductor member insulatingly overlying said substrate, a first transfer gate conductor member insulatingly overlying said substrate and having at least a portion thereof spaced between said first source conductor member and said first receiver conductor member and insulated from said first source conductor member and said first receiver conductor member, means applying a first voltage between said first source conductor member and said substrate to form a first charge storage region in said substrate, means applying a second voltage between said first receiver conductor member and said substrate to form a second charge storage region in said substrate, said second charge storage region being spaced from said first charge storage region to form a barrier region between said storage regions and underlying said first transfer gate conductor member, means applying a third voltage between said first transfer gate conductor member and said substrate for controllably varying the surface potential of said barrier region for controlling the transfer of charge from said first storage region to said second storage region, a second transfer gate conductor member insulatingly overlying said substrate and having at least a portion thereof spaced between said first transfer gate conductor member and one of said source and receiver conductor members, said first transfer gate conductor member overlying one portion of said barrier region and said second transfer gate conductor member overlying another portion of said barrier region, said portions of said barrier region arranged in end-to-end relationship between said first storage region and said second storage region, means applying a fourth voltage between said second transfer gate conductor member and said substrate for controllably varying the surface potential of said other portion of said barrier region for controlling the transfer of charge from said first storage region to said second storage region.

15. A semiconductor device comprising a substrate of semiconductor material of one conductivity type, a plurality of source and receiver conductor members insulatingly overlying said substrate, a plurality of transfer gate conductor members insulatingly overlying said substrate, each spaced between respective adjacent source and receiver conductor members, means applying a first pulsating voltage to alternate ones of said source and receiver conductor members to form first charge storage regions in said substrate, means applying a second pulsating voltage between the other of said source and receiver conductor members to form second charge storage regions in said substrate, said second charge storage regions being spaced from said first charge storage regions to form a plurality of barrier regions each underlying a respective one of said transfer gate conductor members, means applying third and fourth phase related pulsating voltages to said transfer gate electrodes to control the transfer of charge therein from said first storage regions to said second storage regions, said source and receiver conductor members and associated transfer gate members being arranged into a pair of input signal channels and an output signal channel, the terminal storage region of one input channel and the initial storage region of said output channel forming a first interchannel barrier region, the terminal storage region of the other input channel and the initial storage region of said output channel forming a second interchannel barrier region, an interchannel transfer gate conductor member included between the terminal source and receiver conductor members of said input channels and the initial source and receiver conductor member of said output channel and overlying said interchannel barrier regions, means applying a fifth voltage between said interchannel transfer gate conductor member and said substrate for controllably varying the surface potential of said interchannel barrier regions for controlling the transfer of charge from the terminal storage regions of said input channels to the initial storage region of said output channel.

16. A semiconductor device comprising a substrate of semiconductor material of one conductivity type, a plurality of source and receiver conductor members insulatingly overlying said substrate, a plurality of transfer gate conductor members insulatingly overlying said substrate, each spaced between respective adjacent source and receiver conductor members, means applying a first pulsating voltage to alternate ones of said source and receiver conductor members to form first charge storage regions in said substrate, means for applying a second pulsating voltage between the other of said source and receiver conductor members to form second charge storage regions in said substrate, said second charge storage regions being spaced from said first charge storage regions to form a plurality of barrier regions each underlying a respective one of said transfer gate conductor members, means applying third and fourth phase related pulsating voltages to said transfer gate electrodes to control the transfer of charge therein from said first storage regions to said second storage regions, said third and fourth phase related pulsating voltages being different from either of said first and second pulsating voltages, said third and fourth voltages being oppositely phased with respect to one another and being synchronized with said first and second voltages, said source and receiver conductor members and associated transfer gate members being arranged into an input signal channel and a pair of output signal channels, the terminal storage region of the input channel and the initial storage region of one of said output channels forming a first interchannel barrier region, the terminal storage region of the input channel and the initial storage region of the other of said output channels forming a second interchannel barrier region, a first interchannel transfer gate conductor member included between the terminal source and receiver conductor member of said input channel and the initial source and receiver conductor member of one of said output channels and overlying said first interchannel barrier region, a second interchannel transfer gate conductor member included between the terminal source and receiver conductor member of said input channel and the initial source and receiver conductor member of the other of said output channels and overlying said second interchannel barrier region, means applying a first control voltage between said first interchannel transfer gate conductor member and said substrate for controllably varying the surface potential of said first interchannel barrier region for controlling the transfer of charge from the terminal storage region of said input channel to the initial storage region of said one output channel, means applying a second control voltage between said second interchannel transfer gate conductor member and said substrate for controllably varying the surface potential of said second interchannel barrier region for controlling the transfer of charge from the terminal storage region of said input channel to the initial storage region of said other output channel.

17. A semiconductor device comprising a substrate of semiconductor material of one conductivity type, a plurality of source and receiver conductor members insulatingly overlying said substrate, a plurality of transfer gate conductor members insulatingly overlying said substrate, each spaced between adjacent source and receiver conductor members, said source and receiver conductor members being arranged in a plurality of rows and a plurality of columns, the conductor members in odd columns being conductively interconnected and the conductor members in even columns being conductively interconnected, said transfer gate conductor members being arranged in a plurality of rows and a plurality of columns, in each of the rows the conductor members located in odd columns being interconnected and the conductor members located in even columns being interconnected, means applying a fixed bias voltage to said source and receiver conductor members to establish storage regions in said substrate underlying said conductor members, means applying a first voltage of one phase to the source and receiver conductor members in the odd columns to form first charge storage regions in said substrate, means applying a second voltage of the opposite phase to the source and receiver conductor members in the even columns to form second charge storage regions in said one conductivity substrate, said second charge storage regions being spaced from said first charge storage regions to form a plurality of barrier regions within said one conductivity substrate each underlying a respective one of said transfer gate conductor members, means selectively applying a pair of oppositely phased control voltages to a row of said transfer gate conductor members, one of said control voltages being applied to the transfer gate conductor members in odd columns for alternately lowering the potentials of corresponding barrier regions to permit charge transfer thereacross and the other of said voltages being applied to the transfer gate conductor members in the even columns for alternately lowering the potentials of corresponding barrier regions to permit charge transfer thereacross, said pair of oppositely phased voltages being synchronized with said first and second voltages, whereby charge is selectively transferred in the charge storage regions in the row of source and receiver conductor members associated with said row of transfer gate conductor members, means applying blocking voltages to the transfer gate conductor members in said even column in rows other than said one row for inhibiting the transfer of charge in the charge storage regions underlying rows of source and receiver conductor members other than said one row.

18. The semiconductor device of claim 17 wherein electrical charges are introduced by electromagnetic radiation incident on said substrate.

* * * * *